United States Patent [19]

Farah

[11] Patent Number: 4,536,741
[45] Date of Patent: Aug. 20, 1985

[54] DIGITAL QUANTIZER

[75] Inventor: Robert L. Farah, Brooklyn, N.Y.

[73] Assignee: AT&T Bell Laboratories, Murray Hill, N.J.

[21] Appl. No.: 552,430

[22] Filed: Nov. 16, 1983

[51] Int. Cl.³ .............................................. H03K 13/01
[52] U.S. Cl. ................................ 340/347 DD; 375/27
[58] Field of Search ................ 340/347 DD, 347 AD; 332/11 D; 375/27

[56] References Cited

U.S. PATENT DOCUMENTS

| | | | |
|---|---|---|---|
| 3,973,199 | 8/1976 | Widmer | 332/11 D |
| 4,206,447 | 6/1980 | Ching et al. | 340/347 DD |
| 4,309,694 | 1/1982 | Henry | 340/347 DD |
| 4,437,087 | 3/1984 | Petr | 375/27 X |
| 4,475,213 | 10/1984 | Medaugh | 340/347 DD |
| 4,475,227 | 10/1984 | Belfield | 375/27 X |

OTHER PUBLICATIONS

P. Cummiskey, N. S. Jayant and J. L. Flanagan, "Adaptive Quantization in Differential PCM Coding of Speech, *The Bell System Technical Journal*, pp. 1105–1118, vol. 52, No. 7, Sep. 1973.

*Primary Examiner*—B. Dobeck
*Attorney, Agent, or Firm*—Thomas Stafford

[57] ABSTRACT

An input signal sample is converted, i.e., quantized, from a first digital code to a second digital code by combining an array of stored differential quantizer decision levels with the input signal sample to obtain an array of partial sum signal values. The signs of the partial sum signal values are algebraically summed and the result is used to obtain the quantizer interval that the input signal sample falls in.

23 Claims, 5 Drawing Figures

F/G. 4

| STEP | $X \geq 0$ ACCUMULATOR | $X \geq 0$ MEMORY | $X < 0$ ACCUMULATOR | $X < 0$ MEMORY |
|---|---|---|---|---|
| 1 | $X$ | 0 | $X$ | 0 |
| 2 | $X - d_{N/2-2}$ | $X - d_{N/2-2}$ | $X - d_{N/2-2}$ | $X - d_{N/2-2}$ |
| 3 | $X - d_{\frac{N}{2}-2} + [d_{\frac{N}{2}-2} - d_{\frac{N}{2}-3}]$ $= X - d_{N/2-3}$ | $X - d_{N/2-3}$ | $X + d_{\frac{N}{2}-2} + [d_{\frac{N}{2}-3} - d_{\frac{N}{2}-2}]$ $= X - d_{N/2-3}$ | $X + d_{N/2-3}$ |
| --- | --- | --- | --- | --- |
| N/2-2 | $X - d_2 + [d_2 - d_1]$ $= X - d_1$ | $X - d_1$ | $X + d_2 + [d_1 - d_2]$ $= X + d_1$ | $X + d_1$ |
| N/2-1 | $X - d_1 + [d_1 - d_0]$ $= X - d_0$ | $X - d_0$ | $X + d_1 + [d_0 - d_1]$ $= X + d_0$ | $X + d_0$ |

FIG. 5

| | $X \geq 0$ | | | $X < 0$ | |
|---|---|---|---|---|---|
| | $\sum_{I=0}^{6} \text{sgn}(X-d_I)$ | $I$ | | $\sum_{I=0}^{6} \text{sgn}(X-d_I)$ | $I$ |
| $d_6 \leq X$ | 7 | 7 | $X < -d_6$ | $-7$ | $-8$ |
| $d_5 \leq X < d_6$ | 5 | 6 | $-d_6 \leq X < -d_5$ | $-5$ | $-7$ |
| $d_4 \leq X < d_5$ | 3 | 5 | $-d_5 \leq X < -d_4$ | $-3$ | $-6$ |
| $d_3 \leq X < d_4$ | 1 | 4 | $-d_4 \leq X < -d_3$ | $-1$ | $-5$ |
| $d_2 \leq X < d_3$ | $-1$ | 3 | $-d_3 \leq X < -d_2$ | 1 | $-4$ |
| $d_1 \leq X < d_2$ | $-3$ | 2 | $-d_2 \leq X < -d_1$ | 3 | $-3$ |
| $d_0 \leq X < d_1$ | $-5$ | 1 | $-d_1 \leq X < -d_0$ | 5 | $-2$ |
| $X < d_0$ | $-7$ | 0 | $-d_0 \leq X$ | 7 | $-1$ |

DIGITAL QUANTIZER

TECHNICAL FIELD

This invention relates to digital code conversion and, more particularly, to quantizing efficiently a digital signal from a first code to a second code.

BACKGROUND OF THE INVENTION

Over the past several years there has been, and continues to be, a tremendous amount of activity in the area of efficient encoding of speech. For an evolving digital telephone network, a most important application is the possible replacement of the 64,000 bit-per-second (b/s) PCM signal (8 bits per time slot, repeated at an 8 kHz rate) with other coding algorithms for telephony—both in the public switched and private line networks. The reason, of course, is to achieve bandwidth compression.

For a realistic mix of input speech and voiceband data, adaptive differential PCM appears to be a most promising approach. One form of adaptive differential PCM (ADPCM) coding is disclosed, for example, in copending application Ser. No. 343,355, filed Jan. 27, 1982 now U.S. Pat. No. 4,437,087 (D. W. Petr Case 1) and can be considered a benchmark since a single encoding with this ADPCM coder at 32 kb/s is near to being subjectively equivalent to 64 kb/s mu-255 PCM. To this end, an adaptive quantizer is employed for converting the digital PCM signals into the ADPCM signals and vice versa. See for example, the arrangement described in an article by P. Cummiskey, N. S. Jayant and J. L. Flanagan entitled "Adaptive Quantization in Differential PCM Coding of Speech", *Bell System Technical Journal*, Vol. 52, No. 7, September 1973, pp. 1105–1118.

In quantizing an input signal, the objective is to determine within which quantizer input interval the input signal sample falls and, then, generate a corresponding output interval signal sample and a quantized version of the input signal.

One technique for determining which quantizer input interval the input signal sample falls in compares the input signal sample to each quantizer input interval decision level starting from the largest decision level. When a decision level is found which is less in value than the input signal sample, the input signal sample is determined to fall in the interval bounded by that decision level and the next larger decision level. Then, the quantizer output sample is equal to the next larger decision level and the quantized version of the input signal sample is obtained by a table look-up. A problem with this technique is that a plurality of tests and a corresponding plurality of branches are required to generate the desired signal samples.

Another technique in use employs a so-called binary search to obtain the quantizer interval that the input signal sample falls in. Again, this technique requires a plurality of tests and a corresponding plurality of branches to obtain the desired signal samples.

In implementations that employ digital signal processors, (DSPs) or the like, such tests and branches are extremely undesirable because the DSPs are so-called pipeline processors and branching typically causes the pipeline to be broken. Once broken, the pipeline must be refilled with necessary data after the individual branching operations are completed before going on to the next operation to be performed. This filling of the processor pipeline is time consuming, thereby leading to inefficient use of the processor.

SUMMARY OF THE INVENTION

A digital input signal is efficiently converted from a first digital code to a second digital code, i.e., quantized, in accordance with an aspect of the invention, by storing an array of differential quantizer decision level values which are combined with the digital input signal to obtain an array of partial sum signal values. Signs, i.e., positive or negative, of the values of the partial sum signals are algebraically combined and the result is advantageously utilized to obtain the second code quantizer interval that the input signal falls in.

More specifically, it is first determined whether a digital input signal sample to be converted from a first digital code to a second digital code, i.e., being quantized, has a positive or negative value. Then, the input signal sample is combined with an appropriately stored array of differential quantizer decision levels dependent on whether the input signal sample value is positive or negative to obtain a corresponding array of partial sum signal values. The partial sum signal values are either positive or negative. Then, the signs of the partial sum signal values are algebraically combined and the result is advantageously used to obtain the second digital code signal sample. In one embodiment of the invention, the signs of the partial sum signal values are algebraically added and the result is divided by a predetermined value, for example, 2 and, then, a prescribed value dependent on the sign of the input signal sample value and the number of quantizer output levels is added to the result of the division. The resulting signal value is truncated to obtain the second code digital signal sample. Alternatively, the obtained digital signal sample may be translated to some other desired second code signal sample.

BRIEF DESCRIPTION OF THE DRAWING

The invention will be more fully understood from the following detailed description of an illustrative embodiment taken in connection with the appended figures in which:

FIG. 4 is a table showing the operation of the accumulator and the resulting partial sum signals stored in memory for negative and positive input signal samples; and FIG. 5 is a table illustrating the algebraic sum of the signs of the partial sum signals and the translation to corresponding output signals for both positive and negative input signal samples.

DETAILED DESCRIPTION

Figure 1:
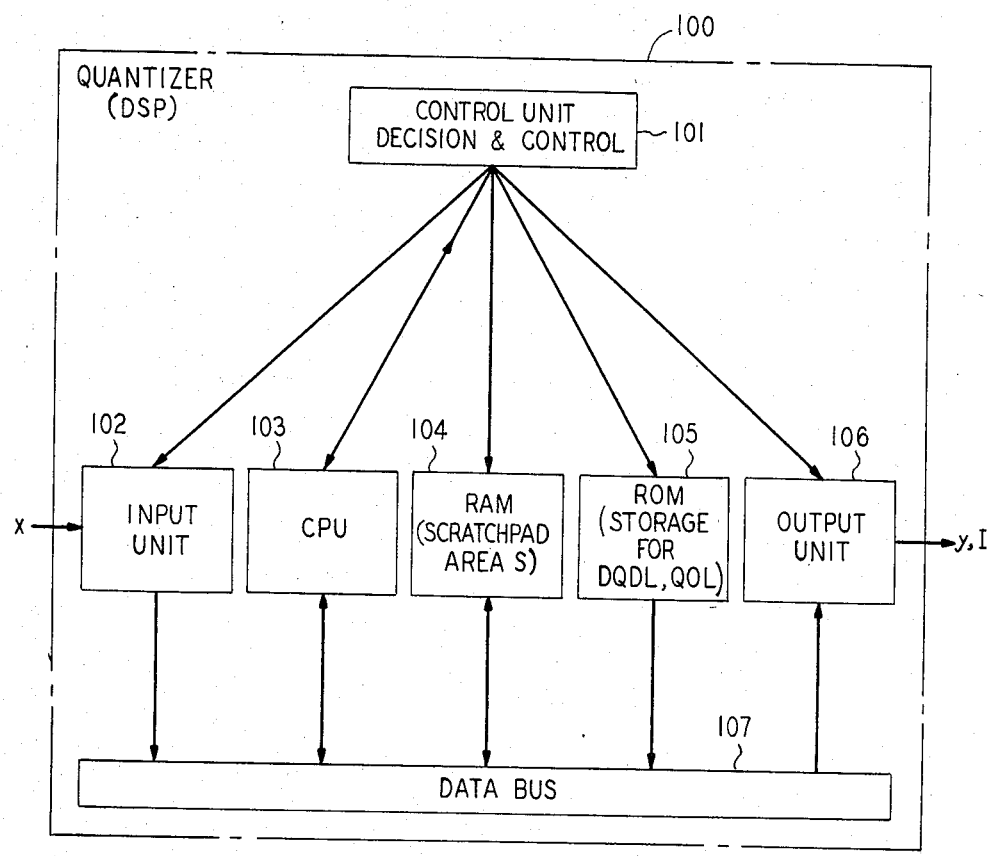
FIG. 1 shows in simplified block diagram form a quantizer including an embodiment of the invention.

FIG. 1 shows in simplified block diagram form details of a processor, in this example, a digital signal processor (DSP) in which an embodiment of the quantizer invention is implemented.

Accordingly, the DSP includes control unit 101, input unit 102, central processor unit (CPU) 103, RAM memory 104, ROM memory 105, output unit 106 and data bus 107. A number of digital signal processor units are known in the art. In this example, a DSP is employed which contains a so-called conditional register set instruction. The conditional register set instruction, as will be shown below, is employed to determine whether the input signal sample X is positive or negative. One such DSP unit is described in several articles in *The Bell System Technical Journal*, Vol. 60, No. 7, Part 2, September 1981 and is manufactured by AT&T Western Electric.

Accordingly, quantizer 100, in accordance with an aspect of the invention, is realized by storing tables of differential quantizer decision levels (DQDLs) and quantizer output levels (QOLs) in ROM 105 along with program steps for realizing the quantizer. First and second tables of differential quantizer decision levels (DQDLs) are stored in ROM 105; one for positive values of input sample X and the other for negative values of input samples X.

Figure 3:
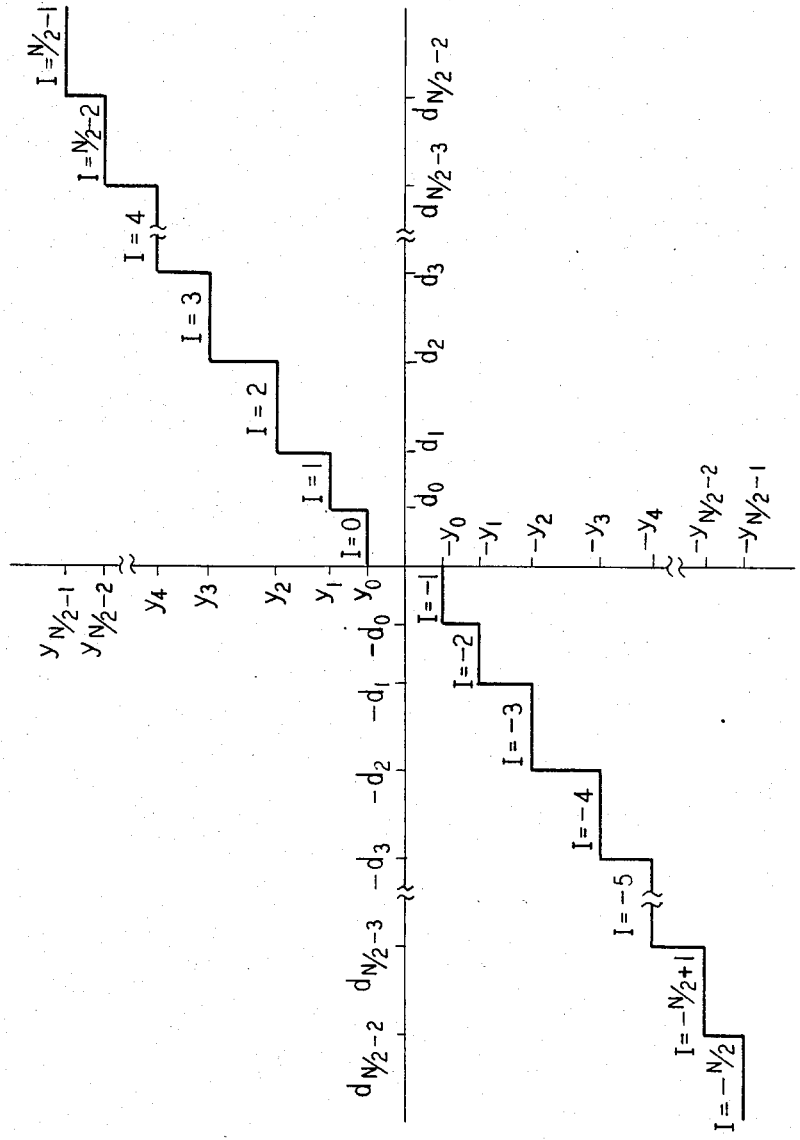
FIG. 3 illustrates in graphical form an unscaled, nonuniform quantizer characteristic useful in describing the invention.

Referring to FIG. 3, there is shown a typical nonuniform quantizer characteristic, where d represents the decisions levels, y represents the output levels, I represents the quantizer intervals and N is the number of quantizer intervals or steps. In one example, N equals 16.

The DQDLs for $X \geq 0$ and for $X < 0$ are shown as part of the accumulator running sum shown in FIG. 4. For example, the DQDLs for $X \geq 0$ are $$d_{\frac{N}{2}-2}, d_{\frac{N}{2}-2} - d_{\frac{N}{2}-3}, \ldots d_2 - d_1 \text{ and } d_1 - d_0.$$

Similarly, the DQDLs for $X < 0$ are $$-d_{\frac{N}{2}-2}, d_{\frac{N}{2}-3} - d_{\frac{N}{2}-2}, \ldots d_1 - d_2 \text{ and } d_0 - d_1.$$

These DQDL values are combined advantageously with the input sample X to generate partial sum signals. The signs, i.e., positive or negative, of the partial sum signals are then combined and utilized to generate the appropriate quantizer interval signal sample I and quantizer output level y.

Operation of the DSP in realizing quantizer 100, in accordance with an aspect of the invention, is described in the program listing shown in the Appendix. This program listing, written in assembly language for the AT&T Western Electric digital signal processor (DSP) unit, is a description of the set of electrical control signals that serve to configure the DSP into quantizer 100 for converting input signal samples X from a first digital code to a second digital code. In this example, the first digital code is linear PCM and the second code is adaptive differential PCM (ADPCM). The linear PCM samples X may be derived from other PCM codes, e.g., mu-law or A-law. Additionally, in this example, the ADPCM code is 4 bit (n=4). However, it is noted that the invention is in no way limited to this 4-bit differential transmission and n could be any other number, e.g., n=2, n=3, n=5, etc. If the input PCM samples were always representative of encoded speech then, a 2-bit differential PCM signal (i.e., n=2) should prove adequate for many applications.

Figure 2:
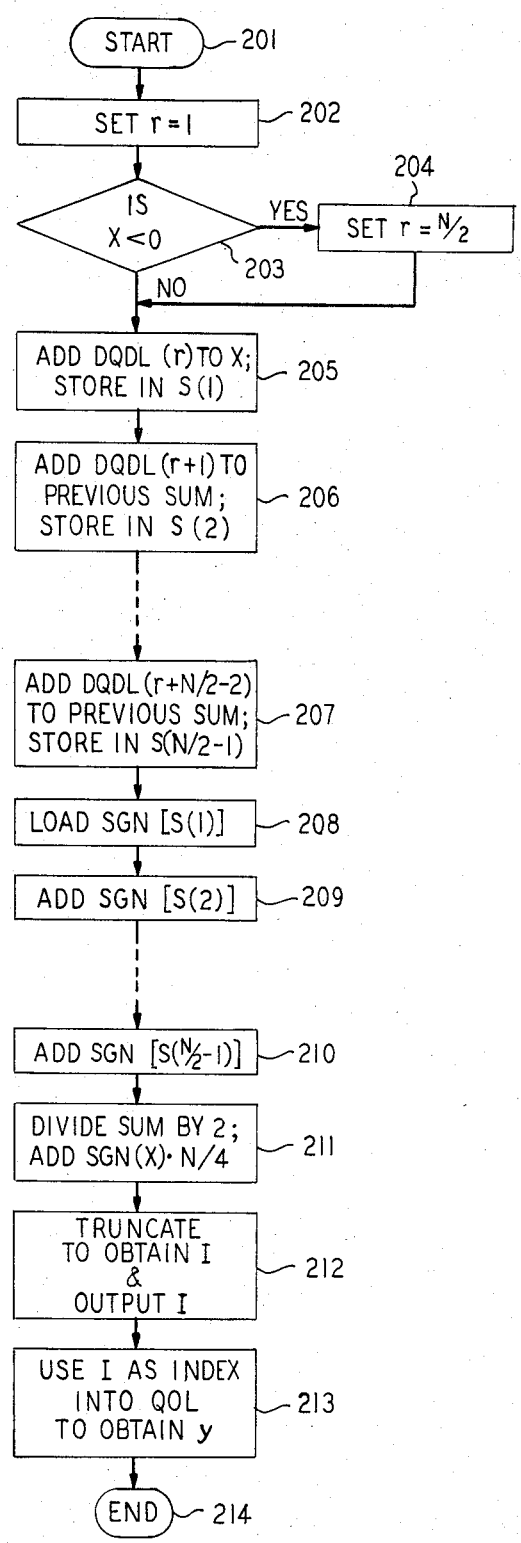
FIG. 2 depicts a flow chart describing operation of the quantizer shown in FIG. 1 in realizing the invention.

The program listing and, hence, operation of quantizer 100, in accordance with an aspect of the invention, is more readily understood with the aid of the flow chart shown in FIG. 2.

Accordingly, the quantizer program routine is entered via oval 201 and, therefore, control is transferred to operational block 202 which causes register r in unit 101 to be set to 1.

Decision step 203 tests to determine if $X < 0$. If the test result is NO, $X \geq 0$ and r remains equal to 1. This causes the first table of DQDLs for $X \geq 0$ stored in ROM 105 to be used in obtaining the appropriate quantizer outputs. If the test result in step 203 is YES, then sample $X < 0$ and operational block 204 causes r to be set to N/2 and the second table of DQDLs for $X < 0$ is used in obtaining the appropriate quantizer outputs. It is noted that step 203 is not a conditional branch point which would break the processor pipeline, but instead a step which causes a register in the DSP to be set in order to select either the first or second table of DQDLs.

Operational blocks 205, 206 through 207 cause a running sum signal to be generated in an accumulator of the DSP and the resulting partial sum signals to be stored in appropriate locations in RAM 104. These operations are shown in graphical form in FIG. 4. It is noted that the resulting partial sum signals can have positive or negative values. The partial sum signal signs, i.e., positive or negative, are algebraically combined in operational blocks 208, and 209 through 210. In this example, the partial sum signal signs are algebraically added. Then, the result of the algebraic adding of the signs of the partial sum signals is utilized advantageously, in accordance with an aspect of the invention, to obtain the appropriate quantizer 100 output signals, namely, I and y.

To this end, operational block 211 divides the sign sum by a predetermined value, in this example 2, and then adds a prescribed value to the result of the division. In this example, the prescribed value is in predetermined relationship to the number of quantizer intervals N and dependent on the sign of the input signal sample value X being quantized, namely, $\text{sgn}(X) \cdot N/4$.

The resulting signal value is caused to be truncated by operational block 212 to obtain the appropriate integer value of the n-bit differential PCM output I. In this example, n=4. Signal sample I is then outputted via output unit 106. The operations of steps 208, 209 through 210, 211 and 212 are summarized in graphical form in FIG. 5. Again, this example assumes that N=16. Thus, it is seen that the operation of step 211 is to utilize the resulting sign sum of the partial sum signals, in accordance with an aspect of the invention, to obtain the appropriate differential PCM output sample I.

Operational block 213 then uses output signal sample I as an index into a table of quantizer output levels (QOLs) to obtain the corresponding value of y. The signal y is used as desired to perform other functions. For example, it may be used in an adaptive predictor. Additionally, output signal sample I may be an index into another lookup table to generate a translated signal sample value I'.

The routine is then exited via oval 214.

The above described arrangement is, of course, merely illustrative of an application of the principles of the invention. Other arrangements may be devised by those skilled in the art without departing from the spirit or scope of the invention. For example, the invention may be implemented in digital circuit form on a chip. Moreover, the differential output signal sample I may be the output as desired in the second digital code or, alternatively, signal sample I may be used to generate another so-called translated second code signal sample I'. For example, signal sample I=0 may be translated to a second code signal sample I'=1 or I=−8 may be translated to a second code signal sample I'=0 as desired.

APPENDIX

```
/*      pd has positive differential quantizer decision levels
        (DQDLs)                                                         */
/*      nd has negative differential quantizer decision levels
        (DQDLs)                                                         */
/*      hd is RAM scratchpad                                            */
/*      qtbl has quantizer output                                       */
/*      a thru g are differential quantizer decision levels
        in ascending order                                              */
/*      register 1 has been set to 1                                    */
/*      accumulator and product registers have X,
        the quantity to be quantized                                    */
        auc=0×7;              /* set c=2**18 and truncation             */
        rx=&pd;               /* set rx to positive DQDl table          */
        if(a<0)doset();       /* neg. number to be quantized            */
        rx=&nd;               /* yes, set rx to negative DQDL
                                 table                                  */
        rda=&hd[0];           /* set rda to scratchpad address          */
        rya=&hd[0];           /* set rya to scratchpad address          */
/*      compute difference between X and each DQDL and store
        difference                                                      */
                  a=p         p=rxi;    /* fetch g. into p reg.         */
                  a=p+a       p=rxi;    /* a has X-g; p gets (f-g)      */
          w=a     a=p+a       p=rxi;    /* a has X-f; p gets (e-f)      */
  rdp=w   w=a     a=p+a       p=rxi;    /* a has X-e; p gets (d-e)      */
  rdp=w   w=a     a=p+a       p=rxi;    /* a has X-d; p gets (c-d)      */
  rdp=w   w=a     a=p+a       p=rxi;    /* a has X-c; p gets (b-c)      */
  rdp=w   w=a     a=p+a       p=rxi;    /* a has X-b; p gets (a-b)      */
/*      compute sum of sign difference                                  */
  rdp=w   w=a     a=p+a       p=1*c*sgn(ryp);  /* a has X-a; p gets
                                                  sgn (X-g)             */
  rdp=w   w=a     a=p         p=1*c*sgn(ryp);  /* p gets sgn (X-g)      */
                  a=p+a       p=1*c*sgn(ryp);  /* p gets sgn (X-e)      */
                  a=p+a       p+1*c*sgn(ryp);  /* p gets sgn (X-d)      */
                  a=p+a       p=1*c*sgn(ryp);  /* p gets sgn (X-c)      */
                  a=p+a       p=1*c*sgn(ryp);  /* p gets sgn (X-b)      */
                  a=p+a       p+1*c*sgn(w);    /* p gets sgn (X-a)      */
                  a=p+a       p=rxi*c;         /* +4 or −4              */
                  a=p+a/2     p=&qtbl*c;       /* a has index into
                                                  qtbl                  */
                                        /* p has &qtbl                  */
          w=a     a=p+a;                /* w has I; a has &y(I)         */
          w=a                           /* w has &y(I)                  */
          .
          .
          .
/*      pd has positive differential quantizer decision levels          */
        pd:     −g
                g-f
                f-e
                e-d
                d-c
                c-b
                b-a
/*      nd has negative differential quantizer decision levels          */
        nd:     g
                f-g
                e-f
                d-e
                c-d
                b-c
                a-b
/*      qtbl has quantizer output values                                */
                −y7
                −y6
                −y5
                −y4
                −y3
                −y2
                −y1
                −y0
                −y0
        qtbl:   y0
                y1
                y2
                y3
                y4
                y5
                y6
                y7
```

What is claimed is:

1. Apparatus for converting a digital input signal from a first digital code to a second digital code, characterized by,
   means for storing an array of differential quantizer decision levels,
   means for combining the digital input signal with said stored differential quantizer decision levels to obtain an array of partial sum signal values, said partial sum signal values having either positive or negative value signs,
   means for algebraically combining the signs of said partial sum signal values, and
   means for utilizing the result of said algebraic combination of said signs to obtain a second code digital representation of said digital input signal.

2. The apparatus as defined in claim 1 wherein said utilizing means includes means for dividing said result of said algebraic combination of said signs by a predetermined value and means for adding a prescribed value to the result of said dividing.

3. The apparatus as defined in claim 2 wherein said converting apparatus includes a quantizer characteristic having a predetermined number of quantizer intervals, and wherein said prescribed value is dependent on the number of quantizer intervals in the quantizer characteristic and the sign of the input signal sample value.

4. The apparatus as defined in claim 3 wherein said predetermined value is 2.

5. The apparatus as defined in claim 3 wherein said prescribed value is (sign X)·N/4 where X is the input signal sample and N is the number of intervals in the quantizer characteristic.

6. The apparatus as defined in claim 5 wherein N is 16.

7. The apparatus as defined in claim 3 further including means for truncating the value resulting from adding said prescribed value to obtain an integer value of a second code signal sample value corresponding to said input signal sample.

8. The apparatus as defined in claim 7 wherein said second code sample value is n-bit differential PCM and said first code sample value is linear PCM.

9. The apparatus as defined in claim 8 wherein n equals 4.

10. The apparatus as defined in claim 7 further including means for storing an array of quantizer output level values each identified by an address, said second code sample value being used as an index to address said last named storing means to generate a corresponding quantizer output level signal.

11. The apparatus as defined in claim 10 further including means for translating said second code signal sample value to a prescribed other second code signal sample value.

12. Apparatus for converting a digital input signal sample from a first code to a digital signal sample in a second code, characterized by,
   means for storing a first array of differential quantizer decision levels for positive values of input signal samples,
   means for storing a second array of differential quantizer decision levels for negative values of input signal samples,
   means for determining whether said input signal sample has a positive or negative value,
   means responsive to the result of said determining whether said input signal sample has a positive or negative value for combining said digital input signal sample with the corresponding one of said first or second stored arrays to obtain an array of partial sum signal values, said partial sum signal values having either positive or negative value signs,
   means for algebraically combining the signs of said partial sum signal values, and
   means for utilizing the result of said algebraic combination of said signs to obtain a second code signal sample corresponding to said first code signal sample.

13. The apparatus as defined in claim 12 wherein said utilizing means includes means for dividing said result of said algebraic combination of said signs by a predetermined value and means for adding a prescribed value to the result of said dividing.

14. The apparatus as defined in claim 13 wherein said converting apparatus includes a quantizer characteristic having a predetermined number of quantizer intervals, and wherein said prescribed value is dependent on the number of quantizer intervals in the quantizer characteristic and the sign of the input signal sample value.

15. The apparatus as defined in claim 14 wherein said predetermined value is 2, and wherein said prescribed value is (sign X)·N/4 where X is the input signal sample and N is the number of intervals in the quantizer characteristic.

16. The apparatus as defined in claim 15 further including means for truncating the second code signal sample value to obtain an integer value.

17. The apparatus as defined in claim 16 further including means for storing an array of quantizer output level values each identified by an address, said second code sample value being used as an index to address said last named storing means to generate a corresponding quantizer output level signal.

18. The apparatus as defined in claim 17 further including means for translating said second code signal sample value to a prescribed other second code signal sample value.

19. A method of converting a digital input signal sample from a first code to a second code, comprising the steps of,
   storing an array of differential quantizer decision levels,
   combining said stored differential quantizer decision levels with the digital input signal samples to obtain an array of partial sum signal values, said partial sum signal values having either positive or negative value signs,
   algebraically combining said partial sum signal value signs, and utilizing the result of said algebraic combination of said signs to obtain a digital signal sample in said second code.

20. A method of converting a digital input signal sample from a first code to a digital signal sample in a second code comprising the steps of, storing a first array of differential quantizer decision levels for positive values of input signal samples, storing a second array of differential quantizer decision levels for negative values of input signal samples, determining whether said input signal sample has a positive or negative value, selecting said first stored array when said input signal sample value is positive or said second stored array when said input signal sample value is negative, combining said selected stored array of differential quantizer decision levels with said input signal sample to obtain an array of partial sum signals having either positive or negative signal value signs, algebraically combining said partial sum signs, and utilizing the result of said algebraic combination of said signs to obtain a second code signal sample corresponding to said input signal sample.

21. The method as defined in claim 20 wherein said step of utilizing includes, dividing the result of said algebraic combination by a predetermined value and, then, adding a prescribed value to the result of said dividing step.

22. The method as defined in claim 21 wherein said prescribed value is dependent on a number of quantizer input intervals in the quantizer characteristic and the sign of the input signal sample value.

23. The method as defined in claim 22 wherein said predetermined value is 2 and wherein said prescribed value is $$(\text{sign } X) \cdot N/4$$

where X is the input signal sample and N is the number of intervals in the quantizer characteristic.

* * * * *